United States Patent [19]

Sasaki

[11] Patent Number: 4,512,074

[45] Date of Patent: Apr. 23, 1985

[54] METHOD FOR MANUFACTURING A SEMICONDUCTOR DEVICE UTILIZING SELECTIVE OXIDATION AND DIFFUSION FROM A POLYCRYSTALLINE SOURCE

[75] Inventor: Gen Sasaki, Yokohama, Japan

[73] Assignee: Tokyo Shibaura Denki Kabushiki Kaisha, Japan

[21] Appl. No.: 528,793

[22] Filed: Sep. 2, 1983

[30] Foreign Application Priority Data

Sep. 9, 1982 [JP] Japan .................... 57-157023

[51] Int. Cl.$^3$ .................... H01L 21/225; H01L 21/76
[52] U.S. Cl. .................... 29/576 W; 29/578;
29/580; 148/1.5; 148/175; 148/187; 148/188;
357/20; 357/34; 357/50; 357/59
[58] Field of Search ............ 29/576 J, 576 R, 578,
29/576 W, 580; 148/1.5, 187, 175, 188; 357/20,
34, 64, 59, 50

[56] References Cited

U.S. PATENT DOCUMENTS

| | | | |
|---|---|---|---|
| 3,648,125 | 3/1972 | Peltzer | 317/235 |
| 3,671,340 | 6/1972 | Irie et al. | 148/187 |
| 3,777,364 | 12/1973 | Schinella et al. | 29/578 |
| 3,879,230 | 4/1975 | Nakamura et al. | 148/1.5 |
| 4,045,249 | 8/1977 | Hotta | 148/1.5 |
| 4,049,478 | 9/1977 | Ghosh et al. | 148/187 |
| 4,110,125 | 8/1978 | Beyer | 148/1.5 |
| 4,338,622 | 7/1982 | Feth et al. | 357/59 X |
| 4,372,033 | 2/1983 | Chiao | 29/571 |
| 4,407,059 | 10/1983 | Sasaki | 29/578 X |
| 4,407,060 | 10/1983 | Sakurai | 29/576 W |

OTHER PUBLICATIONS

Tang et al., "Sub-Nanosecond Self-Aligned I$^2$L/MTL Circuits," IEDM 1979, pp. 201-204.
I. Magdo and A. Bohg, "Framed Recessed Oxide Scheme for Dislocation Free Planar Si Structures", J. Electrochem. Soc., Jun. 1978.

*Primary Examiner*—William G. Saba
*Attorney, Agent, or Firm*—Finnegan, Henderson, Farabow, Garrett & Dunner

[57] ABSTRACT

A method for manufacturing a semiconductor device, comprising the steps of selectively oxidizing a surface of a semiconductor layer of a first conductivity type so as to form a field oxide film, selectively forming an impurity region of a second conductivity type in an element region isolated by the field oxide film, forming a polycrystalline silicon pattern containing an impurity of the first conductivity type on a surface including at least part of the impurity region and the field oxide film, and diffusing the impurity of the first conductivity type from the polycrystalline silicon pattern into the impurity region so as to form another impurity region of the first conductivity type contiguous with the field oxide film, wherein a thickness t of the field oxide film and a concentration n of the impurity of the first conductivity type in the polycrystalline silicon pattern have the following relation:

$$t\,(\mu m) \leqq -0.117 \times 10^{-20}(\mu m \cdot cm^3) \cdot n(cm^{-3}) + 1.42\,(\mu m)$$

for $1 \times 10^{19} \leqq n(cm^{-3}) \leqq 1 \times 10^{21}$.

The method eliminates short-circuiting and flow of leakage current between the collector and emitter, and improves manufacturing yield.

4 Claims, 8 Drawing Figures

F I G. 3
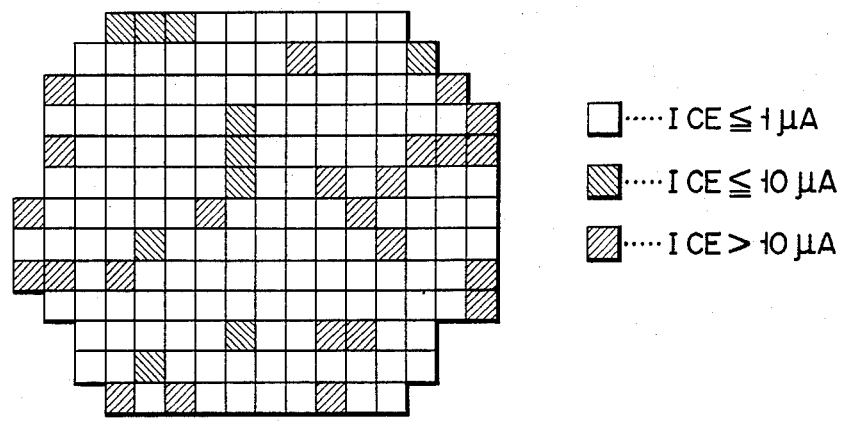
F I G. 4
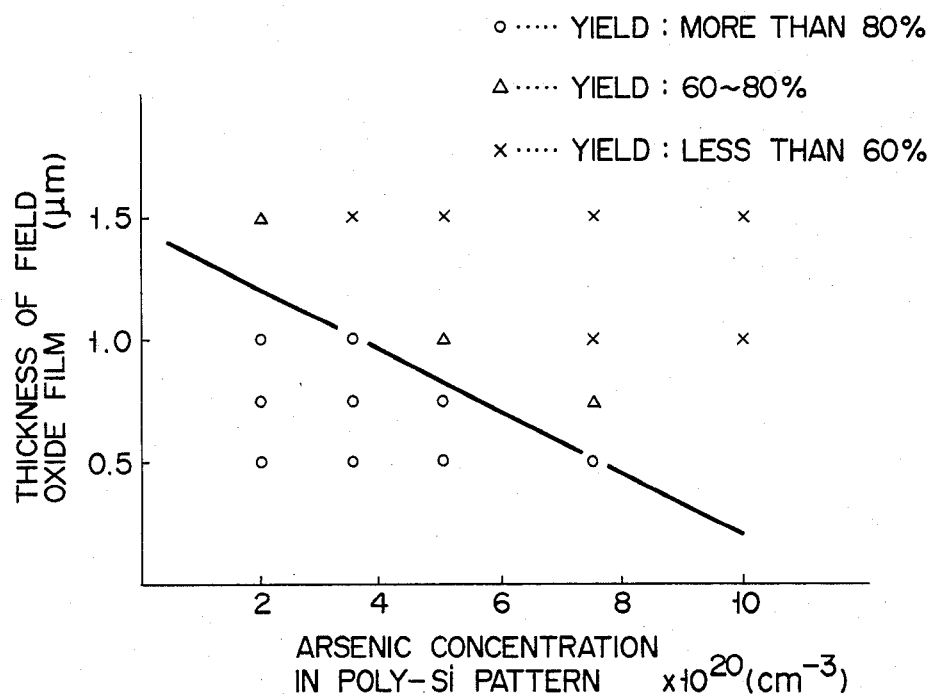

METHOD FOR MANUFACTURING A SEMICONDUCTOR DEVICE UTILIZING SELECTIVE OXIDATION AND DIFFUSION FROM A POLYCRYSTALLINE SOURCE

BACKGROUND OF THE INVENTION

The present invention relates to a method for manufacturing a semiconductor device and, more particularly, to a method for manufacturing a bipolar semiconductor device.

Significant developments have been made recently in micropatterning techniques for semiconductor devices. Techniques of ion-implantation, selective oxidation and the like have contributed to such developments. In the manufacture of bipolar semiconductor devices, selective oxidation, in particular the recessed oxide method (buried oxidation method), is indispensable in attaining higher integration and higher speed. Thus, selective oxidation is generally used in the manufacture of, for example, such bipolar integrated circuits as an I²L (Integrated Injection Logic) and an ECL (Emitter Coupled Logic). Element characteristics of a device can be improved if selective oxidation is utilized together with a technique to be described below. According to this technique, a field oxide film and an element region surrounded thereby are formed in an n-type semiconductor layer as a collector region. After forming a p-type base region in the element region, an arsenic-doped polycrystalline silicon film pattern (a polycrystalline silicon film doped with an n-type impurity having a small diffusion coefficient) is formed on part of the p-type base region and on the field oxide film. Using the arsenic-doped polycrystalline silicon film pattern as a diffusion source, a shallow n+-type emitter region is formed to be contiguous with the field oxide film. At the same time, the polycrystalline silicon film pattern is used for forming electrodes.

Although selective oxidation techniques as described above have various advantages, they are also subject to certain problems. When selective oxidation is performed, dislocations or OSFs (Oxidation-induced Stacking Faults) occur in a portion of a silicon substrate which is immediately below an edge of the field oxide film. When an emitter region is to be formed to be contiguous with the field oxide film, anomalous diffusion of the impurity is caused in the substrate portion immediately below the edge of the field oxide film. The pile-up phenomenon of phosphorus and the like may also be caused upon selective oxidation. As a result of this, the C (collector— E (emitter) withstand voltage is lowered, and the manufacturing yield of the devices is also lowered. These problems become more pronounced with an increase in packing density.

When the relationships among the thickness of a silicon nitride film as a selective oxidation mask, the thickness of the underlying thin buffer oxide film, and dislocations are considered, dislocations can be reduced with a decrease in the thickness of the silicon nitride film and with an increase in the thickness of the buffer oxide film. However, when the thickness of the silicon nitride film is decreased and that of the buffer oxide film is increased, lateral oxidation progresses to produce a large pattern transfer error, thus disabling micropatterning. Accordingly, if selective oxidation is adopted in the manufacture of semiconductor devices, optimal thicknesses of a silicon nitride film and a buffer oxide film must be determined with regard to dislocations and pattern transfer error, so that micro-patterning will not result in a low yield.

However, even when selective oxidation is performed under optimally selected conditions as described above in combination with alternate technique to be described below in order to manufacture a high-speed, high-performance bipolar semiconductor device, an unexpectedly low yield is experienced. The above-mentioned alternate technique involves forming a shallow n-type impurity region (emitter region) with two side surfaces contiguous with a field oxide film using an arsenic-doped poly-crystalline silicon film pattern as a diffusion source. Such a low yield is considered to be attributable not only to the selected oxidation conditions but also to C—E leakage or C—E short-circuiting due to anomalous diffusion of the impurity along crystal defects such as dislocations formed due to impurity concentrations in the polycrystalline silicon film pattern.

SUMMARY OF THE INVENTION

It is an object of the present invention to provide, in a method for manufacturing a semiconductor device comprising the steps of forming a field oxide film by selective oxidation of a surface of a semiconductor substrate and diffusing an impurity into the semiconductor substrate from a polycrystalline silicon pattern, a method for manufacturing a semiconductor device wherein abnormal diffusion of an impurity due to dislocations of OSFs is reduced, C—E leakage or C—E short-circuiting is prevented, and a decrease in the yield is reduced.

According to an aspect of the present invention, there is provided a method for manufacturing a semiconductor device, comprising the steps of:

selectively oxidizing a surface of a semiconductor layer of a first conductivity type so as to form a field oxide film;

selectively forming an impurity region of a second conductivity type in an element region isolated by said field oxide film;

forming a polycrystalline silicon pattern containing an impurity of the first conductivity type on a surface including at least part of said impurity region and said field oxide film; and diffusing the impurity of the first conductivity type from said polycrystalline silicon pattern into said impurity region so as to form another impurity region of the first conductivity type contiguous with said field oxide film;

wherein a thickness t of said field oxide film and a concentration n of the impurity of the first conductivity type in said polycrystalline silicon pattern have the following relation:

$$t(\mu m) \leq -0.117 \times 10^{-20}(\mu m \cdot cm^3) \cdot n(cm^{-3}) + 1.42(\mu m)$$

for $1 \times 10^{19} \leq n(cm^{-3}) \leq 1 \times 10^{21}$.

BRIEF DESCRIPTION OF THE DRAWINGS

FIG. 3 is a map of C—E leakage current within the wafer plane;

FIG. 4 is a graph showing the relationship between the field oxide film thickness, the arsenic concentration in a polycrystalline silicon film pattern, and the yield.

DETAILED DESCRIPTION OF THE PREFERRED EMBODIMENTS

As described above, when a bipolar semiconductor device is manufactured by selective oxidation in combination with a technique described below, C—E leakage or C—E short-circuiting is caused by defects such as dislocations and resultant anomalous diffusion of an impurity along such defects. The above-mentioned technique involves forming an impurity region using an impurity-doped polycrystalline silicon film pattern as a diffusion source and using the polycrystalline silicon film pattern as an electrode. The cause of such defects is stress in a semiconductor layer. This stress increases with an increase in the thickness of a field oxide film formed by selective oxidation and with an increase in the concentration of the impurity doped in the polycrystalline film pattern. When the stress increases beyond a predetermined level due to these factors, defects such as dislocations are formed.

Figure 1:
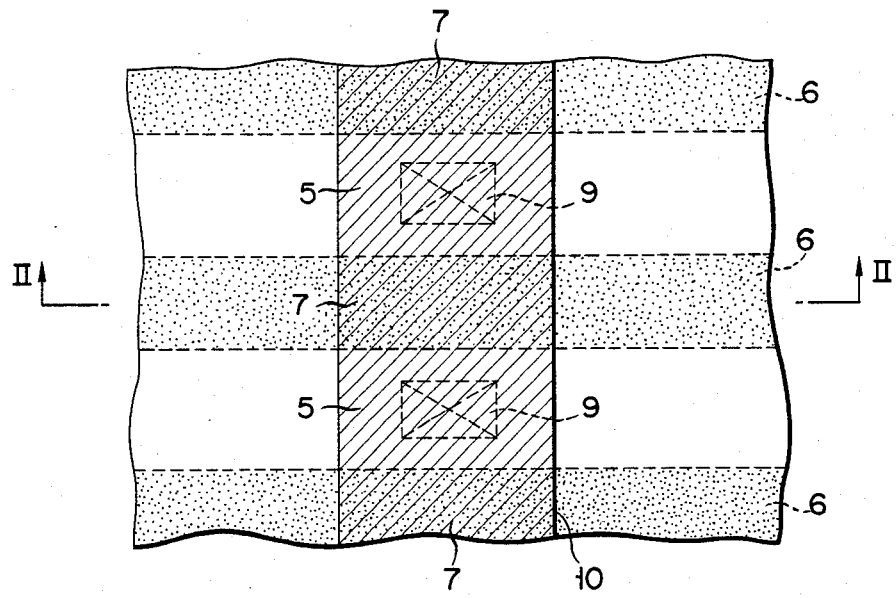
FIG. 1 is a plan view of a transistor array.
Figure 2:
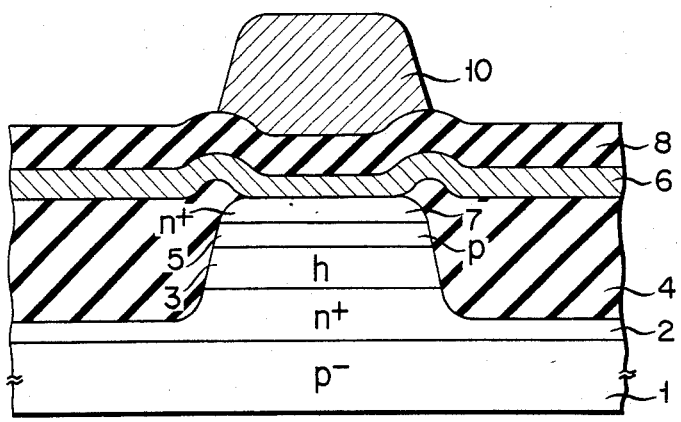
FIG. 2 is a sectional view along the line II—II of FIG. 1.

In view of this, the present inventors have conducted experiments to determine the influence of thickness of field oxide film and impurity concentration in a polycrystalline silicon film pattern upon yield. The experimental results were strictly evaluated using a transistor array of 10,000 elements comprising the bipolar transistors shown in FIG. 2. The transistor array as shown in FIGS. 1 and 2 is manufactured in the following manner. First, an n+-type buried region 2 is formed in a surface layer of a p−-type silicon substrate 1. Subsequently, after growing an n-type epitaxial layer (collector region) 3 on the entire surface of the structure, a buffer oxide film pattern and a silicon nitride film pattern are formed. Then, the field oxide film 4 and element regions surrounded thereby are formed by selective oxidation. After removing the silicon nitride film pattern and the buffer oxide film pattern, a p-type impurity is ion-implanted into the element regions so as to form respective p-type base regions 5.

After depositing an undoped polycrystalline silicon film on the entire surface of the structure, arsenic is ion-implanted in a uniform concentration. The polycrystalline silicon film is patterned to form arsenic-doped polycrystalline silicon film patterns 6. Arsenic in the polycrystalline silicon film patterns 6 is diffused therefrom so as to form respective n+-type emitter regions 7 each having two side surfaces contiguous with the field oxide film 4. Then, a CVD-SiO$_2$ film 8 is deposited on the entire surface, and contact holes 9 are formed therein. An aluminum film is formed and is patterned to form respective base electrodes 10. The polycrystalline silicon film patterns 6 serve as electrodes for the respective n+-type emitter regions 7 and are connected to measuring pads within the chip. Similarly, the base electrodes 10 are connected to further measuring pads within the chip. The collector electrodes (not shown) extend to the surface from the n+-type buried region 2 and are connected to additional measuring pads.

In a transistor array as described above, with a 300 Å thickness of the buffer oxide film and a 1,000 Å thickness of the silicon nitride film, the oxidation time was varied so as to vary the thickness of the field oxide film 4 within a range of 0.5 to 1.5 μm. The arsenic concentration in the polycrystalline silicon film patterns 6 was varied within a range of $2.5 \times 10^{20}$ to $1.0 \times 10^{21}$ cm$^{-3}$. In measuring a 10,000 element transistor array, a voltage of 0.3 V was applied between collector and emitter pairs, and any transistor which had a leakage current $I_{CE}$ of equal to or less than 1 μA was evaluated to be satisfactory. FIG. 3 shows an example of a map of C—E leakage current within a wafer plane, and FIG. 4 shows the relationship between the thickness of the field oxide film, the arsenic concentration of the polycrystalline silicon film pattern, and the yield.

FIG. 3 demonstrates that elements which generate high leakage currents are present in the central portion of the wafer. High leakage currents of such elements must be suppressed. When defects were observed by etching using a W right etching solution, a dislocation was observed at the crossing point (emitter edge) of the emitter region and the field oxide film in an element which produced a high leakage current. It was thus confirmed that such a dislocation along which anomalous diffusion of arsenic occurs is attributable to C—E leakage.

As can be seen from FIG. 4 the critical conditions of the thickness of the field oxide film and the arsenic concentration in the polycrystalline silicon film patterns for obtaining a yield of 80% were as follows. When the thickness of the field oxide film is 2,500 Å, the arsenic concentration in the polycrystalline silicon film patterns must be $1 \times 10^{21}$ cm$^{-3}$ or less. When the arsenic concentration is $1 \times 10^{20}$ cm$^{-3}$, the thickness of the field oxide film must be 1.3 μm. Thus, it is concluded that a yield of a bipolar semiconductor device can be improved when the equation given below is satisfied:

$$t(\mu m) \leq -0.117 \times 10^{-20}(\mu m \cdot cm^3) \cdot n(cm^{-3}) + 1.42(\mu m)$$

Accordingly, a method for manufacturing a semiconductor device according to the present invention comprises the steps of:
  selectively oxidizing a surface of a semiconductor layer of a first conductivity type so as to form a field oxide film;
  selectively forming an impurity region of a second conductivity type in an element region isolated by said field oxide film;
  forming a polycrystalline silicon pattern containing an impurity of the first conductivity type on a surface which includes at least part of said impurity region and said field oxide film; and
  diffusing the impurity of the first conductivity type from said polycrystalline silicon pattern into said impurity region so as to form an impurity region of the first conductivity type contiguous with said field oxide film; wherein a thickness t of said field oxide film and a concentration n of the impurity of the first conductivity type in said polycrystalline silicon pattern have the following relation:

$$t(\mu m) \leq -0.117 \times 10^{-20}(\mu m \cdot cm^3) \cdot n(cm^{-3}) + 1.42(\mu m)$$

for $1 \times 10^{19} \leq n(cm^{-3}) \leq 1 \times 10^{21}$.

The film thickness of the field oxide film and the impurity concentration in the polycrystalline silicon film pattern must be optimal in accordance with such element characteristics as parasitic capacitance and contact resistance. In view of this, the impurity concentration n in the polycrystalline silicon film pattern was selected to be within the range of $1\times10^{19}$ to $1\times10^{21}$ cm$^{-3}$. If the impurity concentration n is below $1\times10^{19}$ cm$^{-3}$, ohmic contact is difficult to obtain. In addition to this, the resistance of the polycrystalline silicon film itself becomes too high. On the other hand, if the impurity concentration n exceeds $1\times10^{21}$ cm$^{-3}$, the thickness of the field oxide film is limited to 2,500 Å or less. It is difficult to make the thickness of the field oxide film less than 2,500 Å, due to the limits imposed by the epitaxy and diffusion techniques. Furthermore, the parasitic capacitance of the resultant film becomes too high.

A polycrystalline silicon film pattern doped with an impurity of a first conductivity type which is used according to the method of the present invention may be formed by ion-implanting arsenic in an undoped polycrystalline silicon film, annealing the film for uniformly doping arsenic in the film and patterning the film; or may alternatively be formed by depositing an arsenic-doped polycrystalline silicon film by the CVD method and then patterning the deposited film.

Also, phosphorus, antimony or boron may be used as an impurity of a first conductivity type of the present invention in place of arsenic.

Referring to FIGS. 5(a) to 5(d) the method of the present invention will now be described through an example of the manufacture of an npn bipolar transistor.

Figure 5A:
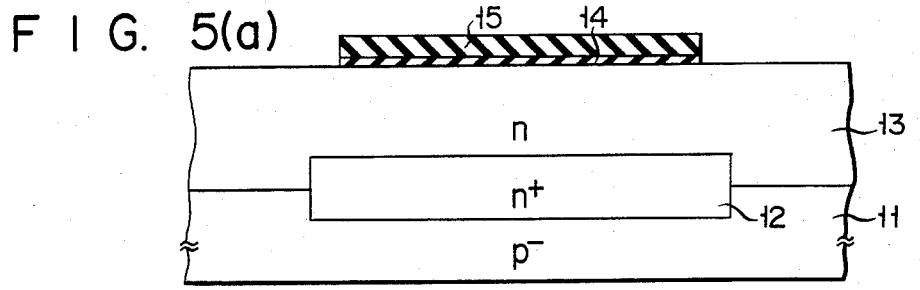
FIG. 5 is a sectional view showing in sequential order the steps for manufacturing an npn bipolar transistor according to an embodiment of the present invention.

Referring to FIG. 5(a), arsenic was selectively diffused in a p$^-$-type silicon substrate 11 so as to form an n$^+$-type buried region 12. After forming an n-type epitaxial layer (collector region) 13 thereover, a buffer oxide film of 300 Å thickness and a silicon nitride film of 1,000 Å thickness were sequentially deposited. These films were patterned to form a buffer oxide film pattern 14 and a silicon nitride film pattern 15, respectively.

Figure 5B:
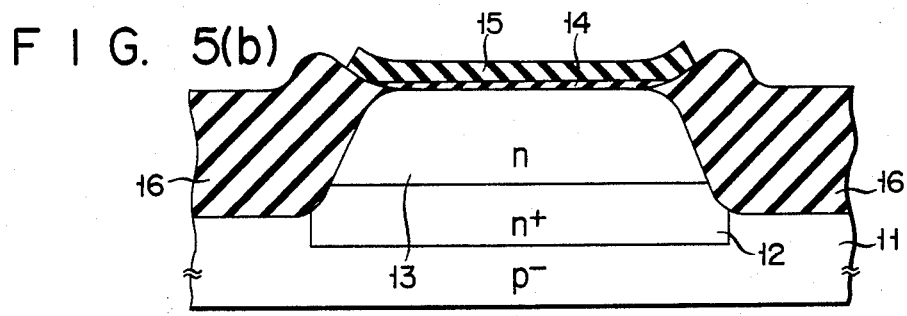

Then, referring to FIG. 5(b), using the silicon nitride film pattern 15 as a mask, anisotropic etching was performed using an etchant mixture consisting of KOH and isopropyl alcohol. Thermal oxidation was then performed at a temperature of 1,000° C. so as to form a field oxide film 16 of 1 μm thickness and an island element region surrounded thereby.

Figure 5C:
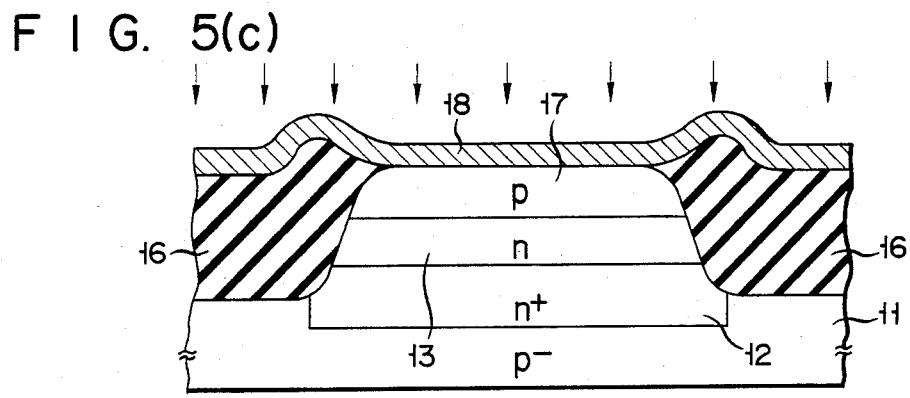

Referring to FIG. 5(c), after sequentially removing the silicon nitride film pattern 15 and the buffer oxide film pattern 14 by etching, a thin thermal oxide film was formed on the surface of the exposed n-type epitaxial layer (collector region) 13. After doping boron ions in part of the n-type epitaxial layer (collector region) 13, annealing was performed to form a p-type base region 17. The portions of the thin oxide film corresponding to a prospective emitter region and prospective contact holes were selectively removed by etching. After depositing an undoped polycrystalline silicon film 18 of 2,000 to 2,500 Å thickness on the entire surface, it was doped with arsenic ions at a dose of $7\times10^{15}$ cm$^{-2}$. Annealing was then performed so as to render the arsenic concentration in the film 18 uniform. Then, the concentration of arsenic in the polycrystalline silicon film 18 was controlled at $\simeq3.5\times10^{20}$ cm$^{-3}$. The thickness (1 μm) of the field oxide film 16 and the arsenic concentration ($\simeq3.5\times10^{20}$ cm$^{-3}$) in the polycrystalline silicon film 18 satisfied the requirements of the present invention.

Figure 5D:
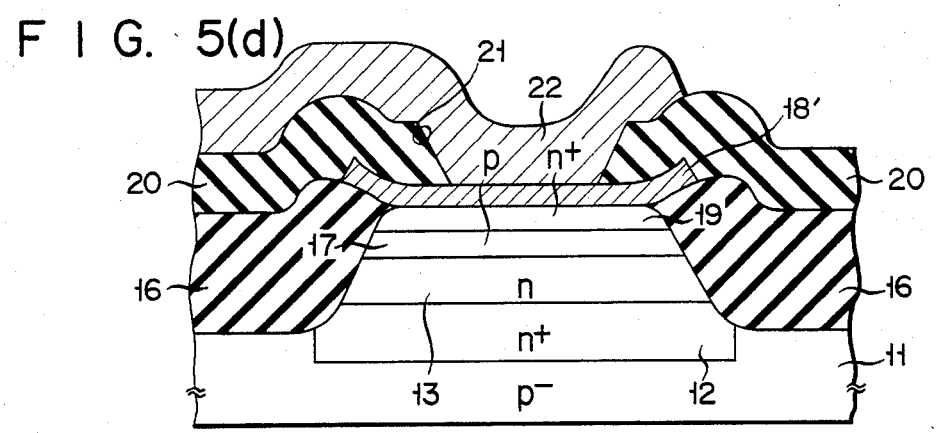

Finally, referring to FIG. 5(d), the polycrystalline silicon film 18 was patterned by photolithography so as to form a polycrystalline silicon film pattern 18' on a part of the p-type base region 17 and on the field oxide film 16. Annealing was then performed so as to form an n$^+$-type emitter region 19 which was opposed to the part of the p-type base region 17 and which had two side surfaces contiguous with the field oxide film 16. Simultaneously, an n$^+$-type contact region (not shown) was also formed. After depositing a CVD-SiO$_2$ film 20 on the entire surface, contact holes 21 were formed in the portions of the CVD-SiO$_2$ film 20 corresponding to the polycrystalline silicon film pattern 18' and other regions. After depositing an Al-Cu-Si film on the entire surface, it was patterned to form a wiring pattern 22, thereby completing the npn bipolar transistor.

According to the method of the present invention, the arsenic concentration in the polycrystalline silicon film pattern 18', used as a diffusion source for forming an emitter region, is determined with regard to the thickness of the field oxide film 16. Dislocations and resultant anomalous diffusion of arsenic at the emitter edge are prevented. As a result, C—E leakage or C—E short-circuiting can be prevented, and the manufacturing yield can be improved significantly.

The method of the present invention can be applied to the manufacture of other types of bipolar transistors such as I$^2$Ls or ECLs.

In the example described above, the base region has a single region structure. However, a p$^+$-type base region may be additionally formed to provide a double base structure. Also, in the example described above, arsenic is doped in an undoped polycrystalline silicon film, and the film is then patterned to form a polycrystalline silicon film pattern. However, an arsenic-doped polycrystalline silicon film may be deposited by the CVD method, and then patterned to form an arsenic-doped polycrystalline silicon film pattern.

What is claimed is:

1. A method for manufacturing a semiconductor device, comprising the steps of:

selectively oxidizing a surface of a semiconductor layer of a first conductivity type so as to form a field oxide film;

selectively forming an impurity region of a second conductivity type in an element region isolated by said field oxide film;

forming a polycrystalline silicon pattern containing an inpurity of the first conductivity type on a surface including at least part of said impurity region and said field oxide film; and diffusing the impurity of the first conductivity type from said polycrystalline silicon pattern into said impurity region so as to form another impurity region of the first conductivity type contiguous with said field oxide film;

wherein a thickness t of said field oxide film and a concentration n of the impurity of the first conductivity type in said polycrystalline silicon pattern have the following relation:

$$t(\mu m) \leq -0.117\times10^{-20}(\mu m\cdot cm^3)\cdot n(cm^{-3}) + 1.42(\mu m)$$

for $1\times10^{19} \leq n(cm^{-3}) \leq 1\times10^{21}$.

2. A method according to claim 1, wherein said impurity region of the second conductivity type constitutes a base region, said impurity region of the first conductivity type constitutes an emitter region and a collector contact region, and said polycrystalline silicon pattern constitutes electrodes for said emitter region and a collector region.

3. A method according to claim 1, wherein said polycrystalline silicon pattern is formed by forming an undoped polycrystalline silicon film on said surface, ion-implanting arsenic in said undoped polycrystalline silicon film, annealing to render an arsenic concentration in said polycrystalline silicon film uniform, and patterning said polycrystalline silicon film.

4. A method according to claim 1, wherein said polycrystalline silicon pattern is formed by depositing an arsenic-doped polycrystalline silicon film on said surface by chemical vapor deposition and subsequently patterning said polycrystalline silicon film.

* * * * *